(12) United States Patent
Sandhu et al.

(10) Patent No.: US 7,858,506 B2
(45) Date of Patent: Dec. 28, 2010

(54) DIODES, AND METHODS OF FORMING DIODES

(75) Inventors: Gurtej S. Sandhu, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 217 days.

(21) Appl. No.: 12/141,265

(22) Filed: Jun. 18, 2008

(65) Prior Publication Data
US 2009/0315020 A1    Dec. 24, 2009

(51) Int. Cl.
*H01L 21/28* (2006.01)
*H01L 21/44* (2006.01)

(52) U.S. Cl. .................. 438/578; 438/576; 257/30; 257/244; 257/E21.353; 257/E29.339

(58) Field of Classification Search .......... 438/576, 438/578; 257/30, 244, E21.353, E29.339
See application file for complete search history.

(56) References Cited

U.S. PATENT DOCUMENTS

| | | | |
|---|---|---|---|
| 3,972,059 | A | 7/1976 | Distefano |
| 5,614,727 | A | 3/1997 | Mauri et al. |
| 6,201,279 | B1 | 3/2001 | Pfirsch |
| 6,462,388 | B1 | 10/2002 | Perner |
| 6,482,685 | B1 | 11/2002 | Chen et al. |
| 6,524,899 | B1 | 2/2003 | Grundbacher et al. |
| 6,980,465 | B2 | 12/2005 | Taussig et al. |
| 2002/0066926 | A1* | 6/2002 | Hshieh et al. ............ 257/330 |
| 2004/0227145 | A1 | 11/2004 | Abe et al. |
| 2005/0230777 | A1* | 10/2005 | Chiola et al. ............ 257/480 |
| 2007/0080426 | A1 | 4/2007 | Mats |
| 2007/0092192 | A1 | 4/2007 | Achouche et al. |
| 2007/0228505 | A1* | 10/2007 | Mazzola et al. .......... 257/471 |
| 2008/0239625 | A1* | 10/2008 | Kermarrec et al. ....... 361/306.3 |

(Continued)

FOREIGN PATENT DOCUMENTS

JP    2002184788    6/2002

(Continued)

OTHER PUBLICATIONS

Phiar Corporation "Why MIIM?" www.phiar.com/whyMIIM.php4; 5 pages.

(Continued)

*Primary Examiner*—Caridad M Everhart
(74) *Attorney, Agent, or Firm*—Wells St. John P.S.

(57) ABSTRACT

Some embodiments include methods of forming diodes in which a first electrode is formed to have a pedestal extending upwardly from a base. At least one layer is deposited along an undulating topography that extends across the pedestal and base, and a second electrode is formed over the least one layer. The first electrode, at least one layer, and second electrode together form a structure that conducts current between the first and second electrodes when voltage of one polarity is applied to the structure, and that inhibits current flow between the first and second electrodes when voltage having a polarity opposite to said one polarity is applied to the structure. Some embodiments include diodes having a first electrode that contains two or more projections extending upwardly from a base, having at least one layer over the first electrode, and having a second electrode over the at least one layer.

22 Claims, 9 Drawing Sheets

U.S. PATENT DOCUMENTS

2008/0272363 A1   11/2008   Mouli

FOREIGN PATENT DOCUMENTS

WO    WO2008/030587 A2    3/2008

WO   PCT/US2009/044801    1/2010

OTHER PUBLICATIONS

Kolyada, Y.E., "High-Current Diode is Intended for Work in Open Air" IEEE 18th Int. Symp. on Discharges and Electrical Insulation in Vacuum-Eindhoven-1998; Mar. 1998; pp. 696-699.

* cited by examiner

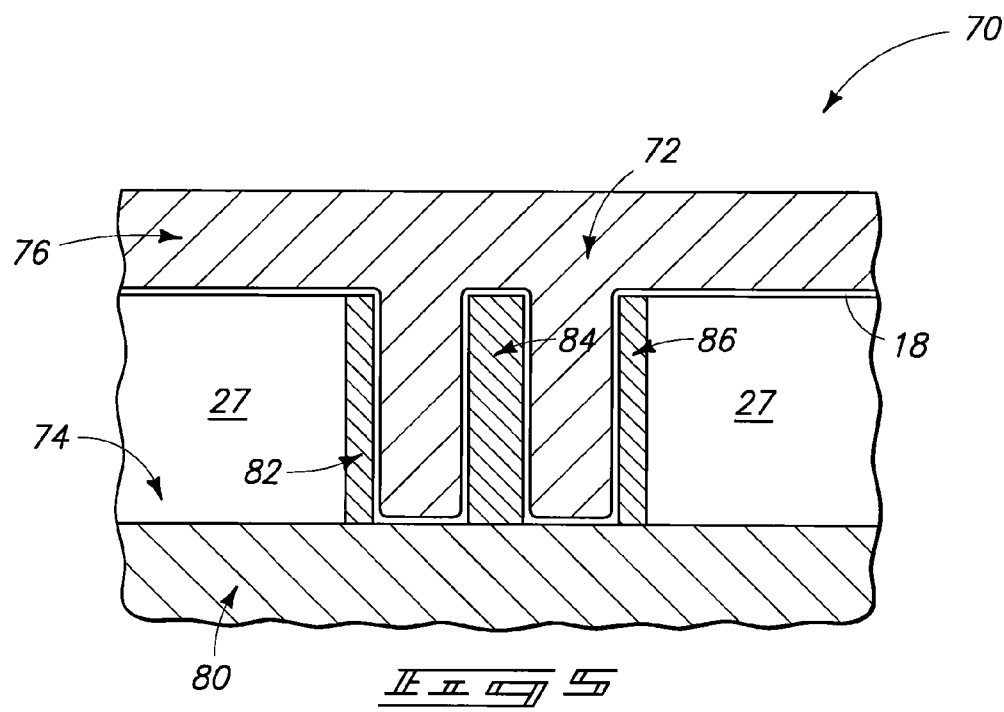
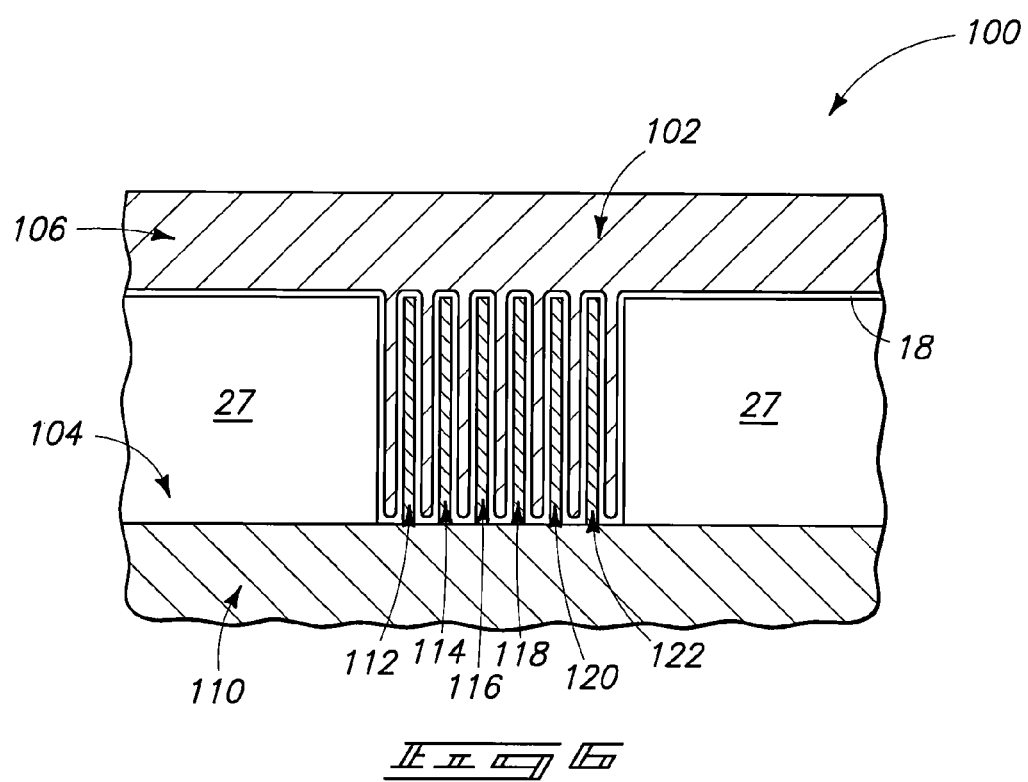

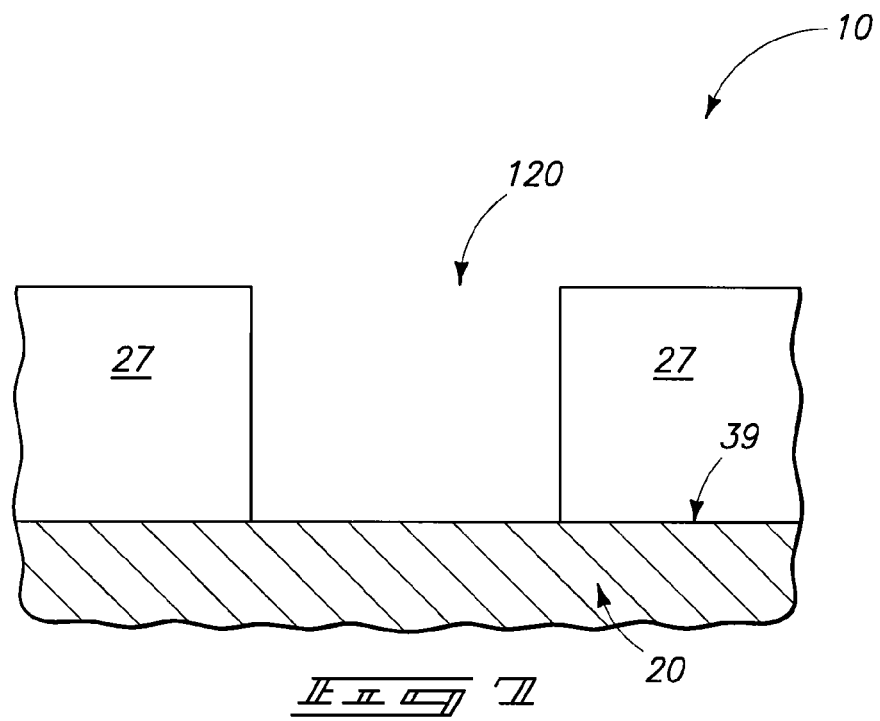
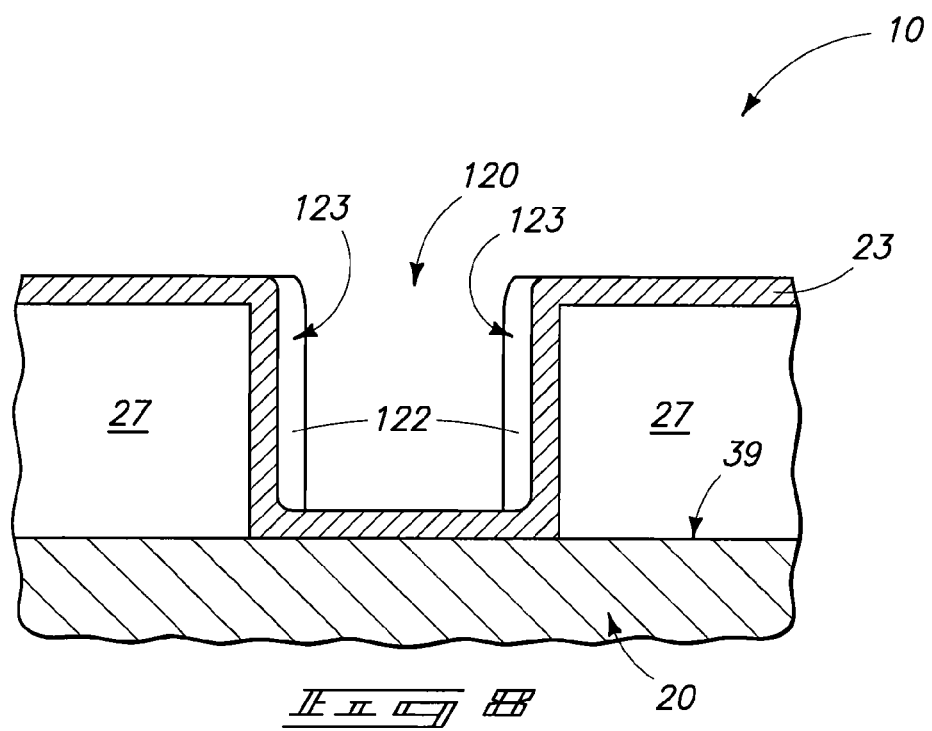

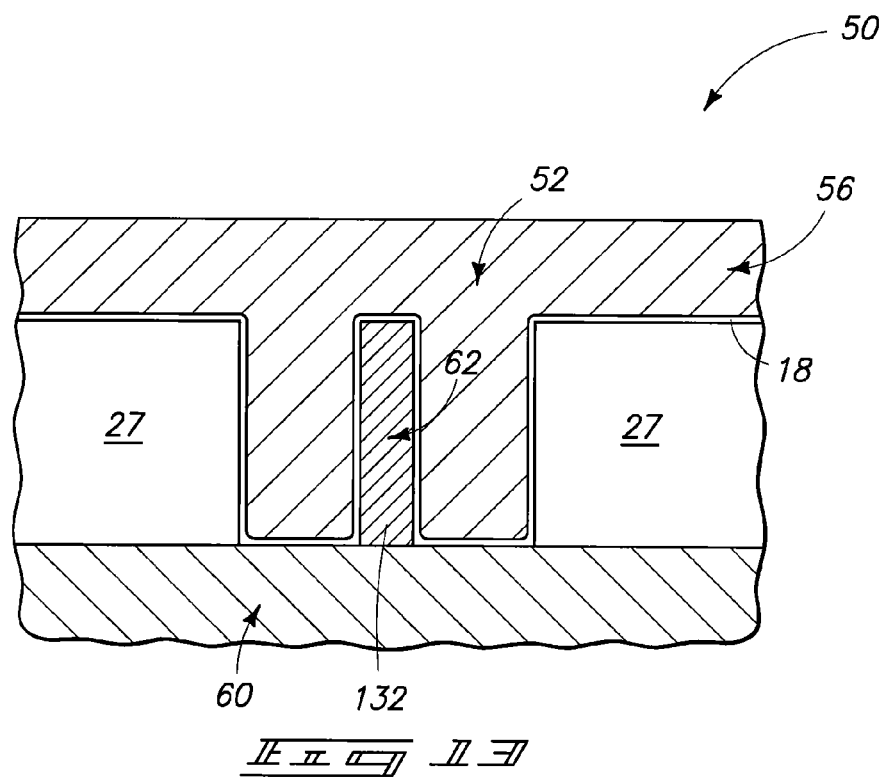
_Fig. 13_
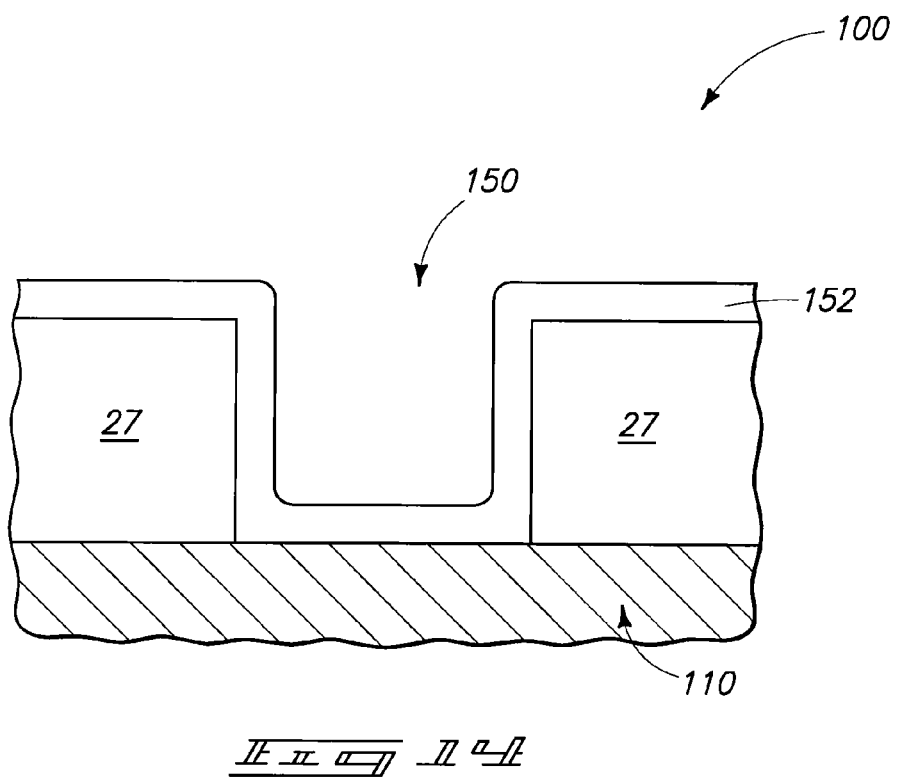
_Fig. 14_

DIODES, AND METHODS OF FORMING DIODES

TECHNICAL FIELD

Diodes, and methods of forming diodes.

BACKGROUND

Select devices are utilized in integrated circuitry for selectively accessing components of the circuitry. Numerous device types may be utilized for select devices of integrated circuitry, with example device types being diodes and transistors.

A continuing goal of integrated circuit fabrication is to increase integration density, and accordingly to decrease the footprint of individual devices by scaling the devices into it increasingly smaller dimensions. Select devices may be particularly difficult to scale in that device performance may be reduced by decreasing the dimensions of the devices.

For instance, a parameter of diode performance that may be important in the overall function of the diode is current flow through the diode. A problem that may occur when a diode is scaled into increasingly smaller dimensions is that the current flow through the diode may become too small relative to the intended operation of the diode.

It would be desirable to develop new diodes, and new methods of forming diodes, which enable desired current flow to be maintained through the diodes as the diodes are scaled to a smaller footprint.

BRIEF DESCRIPTION OF THE DRAWINGS

FIG. 5 is a diagrammatic, cross-sectional view of a portion of a construction illustrating an embodiment.

FIG. 6 is a diagrammatic, cross-sectional view of a portion of a construction illustrating an embodiment.

FIGS. 7-10 are diagrammatic, cross-sectional views of a portion of a construction at various processing stages of an embodiment.

FIGS. 11-13 are diagrammatic, cross-sectional views of a portion of a construction at various processing stages of an embodiment.

FIGS. 14-17 are diagrammatic, cross-sectional views of a portion of a construction at various processing stages of an embodiment.

DETAILED DESCRIPTION OF THE ILLUSTRATED EMBODIMENTS

Figure 1:
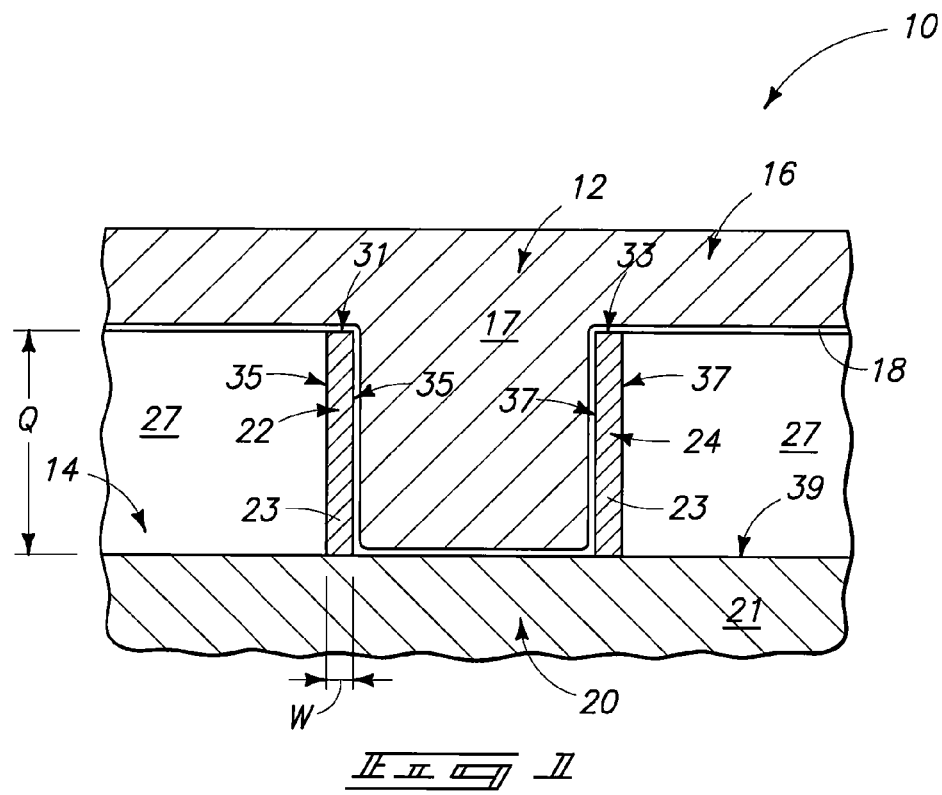
FIG. 1 is a diagrammatic, cross-sectional view of a portion of a construction illustrating an embodiment.

Some types of diodes comprise one or more materials sandwiched between a pair of conductive electrodes. For instance, metal-insulator-metal (MIM) diodes may have one or more insulator materials sandwiched between a pair of conductive electrodes. As another example, some types of Schottky diodes may have one or more semiconductor materials sandwiched between a pair of conductive electrodes.

Conventional diode constructions will have the material that is sandwiched between the conductive electrodes formed as a thin plane. In some embodiments, it is recognized that if the diode constructions are fabricated to have an undulating topography between the two conductive electrodes, enhanced current flow may be obtained relative to diode constructions having a planar topography between the two conductive electrodes.

An example embodiment diode 12 is described with reference to FIG. 1 as a portion of a construction 10. The construction 10 may be supported by a semiconductor wafer, and accordingly may be a semiconductor construction.

The diode 12 comprises a lower electrode 14, an upper electrode 16, and an intermediate diode structure 18 sandwiched between the lower electrode and the upper electrode.

The lower electrode 14 comprises a base 20 and a pair of projections (or pedestals) 22 and 24 extending upwardly from the base. The base comprises a base material 21, and the pedestals comprise conductive material 23. The materials 21 and 23 may be the same composition as one another in some embodiments, and in other embodiments materials 21 and 23 may be compositionally different from one another.

The upper electrode 16 comprises a conductive material 17. Such conductive material may be the same as one or both of materials 21 and 23 of the lower electrode, or may be compositionally different from at least one of the materials 21 and 23.

Conductive materials 21, 23 and 17 may comprise any suitable composition or combination of compositions, and may, for example, comprise, consist essentially of, or consist of one or more of various metals (for instance, tantalum, platinum, tungsten, aluminum, copper, gold, nickel, titanium, molybdenum, etc.), metal-containing compositions (for instance, metal nitride, metal silicide such as tungsten silicide or titanium silicide, etc.), and conductively-doped semiconductor materials (for instance, conductively-doped silicon, etc.).

Intermediate diode structure 18 may comprise any suitable composition or combination of compositions, and may be a single homogeneous layer (as shown), or in other embodiments may comprise two or more distinct layers. If diode 12 is a MIM, intermediate diode structure 18 may comprise one or more electrically insulative compositions. For instance, intermediate diode structure 18 may comprise, consist essentially of, or consist of one or more compositions selected from the group consisting of aluminum nitride, aluminum oxide, hafnium oxide, magnesium oxide, niobium oxide, silicon nitride, silicon oxide, tantalum oxide, titanium oxide, yttrium oxide, and zirconium oxide. The oxides and nitrides are referred to in terms of the principle components, rather than in terms of specific stoichiometries. Accordingly, the oxide of silicon is referred to as silicon oxide, which encompasses the stoichiometry of silicon dioxide.

If diode 12 utilizes Schottky diode characteristics, intermediate diode structure 18 may comprise, consist essentially of, or consist of one or more semiconductor materials (for instance, silicon); and the upper and lower electrodes may comprise, consist essentially of, or consist of one or more metals and/or metal-containing compositions.

The pedestals 22 and 24 may be considered to comprise top surfaces 31 and 33, respectively; and to comprise sidewall surfaces 35 and 37, respectively. The base 20 comprises an upper surface 39, and the sidewall surfaces of the pedestals extend from the upper surface 39 of the base to the uppermost surfaces 31 and 33 of the pedestals.

The surfaces 31, 33, 35, 37 and 39 together form an undulating topography of the first electrode 14. Such undulating topography has highest surfaces corresponding to surfaces 31 and 33, and has a lowest surface corresponding to surface 39. The highest surface is above the lowest surface by a distance "Q". Such distance may be, for example, at least about 50 nanometers; in some embodiments may be from about 50 nanometers to about 500 nanometers; in some embodiments may be from about 200 nanometers to about 500 nanometers; and in some embodiments may be from about 50 nanometers to about one micron.

As discussed above, intermediate diode structure 18 may comprise one or more layers. A total thickness of intermediate diode structure 18 may be less than or equal to about ten percent of the distance "Q". In some embodiments, a thickness of intermediate diode structure 18 may be from about one nanometer to about four nanometers.

The pedestal 22 has a width "W". Such width may be less than or equal to about 50 nanometers in some embodiments.

An electrically insulative material 27 is over base 20, and the upper electrode 16 is at least partially supported by such insulative material. The insulative material 27 may comprise any suitable composition or combination of compositions, and may, for example, comprise one or more of silicon nitride, silicon dioxide, and borophosphosilicate glass.

The electrodes 14 and 16, together with intermediate diode structure 18, form a diode. In other words, the first electrode 14, second electrode 16, and intermediate diode structure 18 together form a structure that conducts current between the first and second electrodes when voltage of one polarity is applied to the structure, and that inhibits current flow between the first and second electrodes when voltage of an opposite polarity is applied to the structure.

Figure 2:
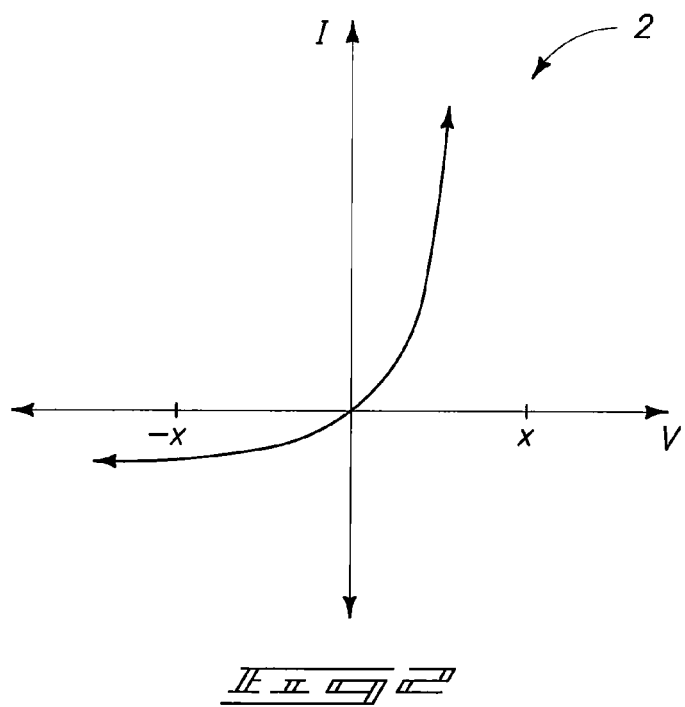
FIG. 2 is a graphical illustration of current versus voltage for a diode.

FIG. 2 shows a graph 2 that diagrammatically illustrates an example embodiment dependence of current flow on voltage for a diode structure of the type shown in FIG. 1. Specifically, positive voltage may be considered to be one polarity, and negative voltage may be considered to be an opposite polarity. When positive voltage is applied there is high current flow through the structure, and when negative voltage is applied there is relatively little current flow through the structure. A couple of example datapoints "x" and "–x" are shown on the voltage scale. Although the embodiment of FIG. 2 shows increased current flow when positive voltage is applied and impedance when negative voltage is applied, in other embodiments the increased current flow may occur when negative voltage is applied and the impedance may occur when positive voltage is applied.

Figure 3:
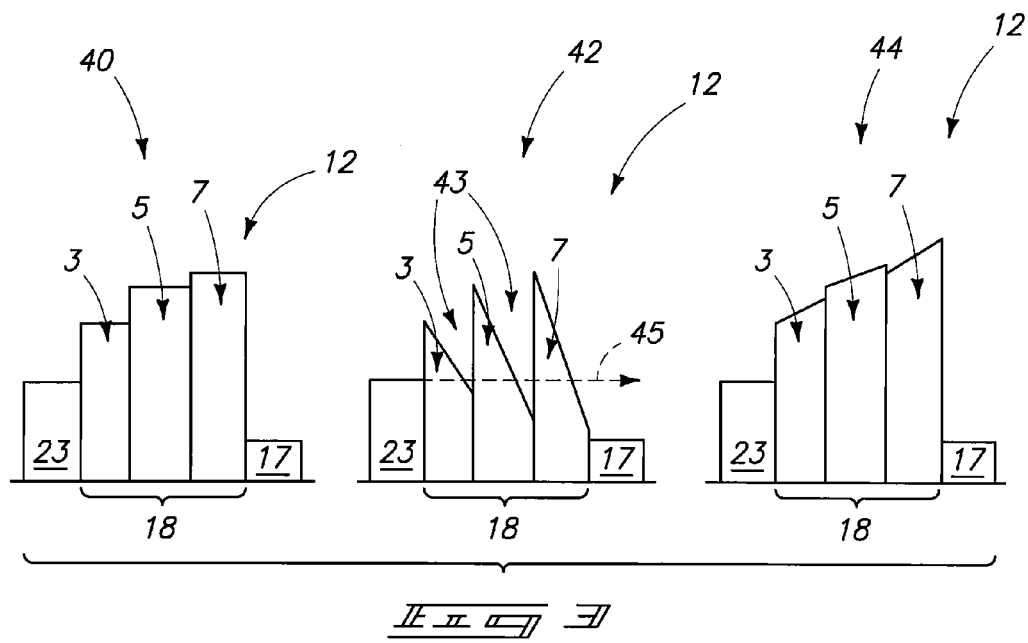
FIG. 3 shows three band-gap diagrams illustrating three different bias conditions of a diode in accordance with an embodiment.

As discussed above, intermediate diode structure 18 may comprise multiple layers. Such layers may be band-gap engineered to create desired diode properties. FIG. 3 shows an example embodiment in which intermediate diode structure 18 comprises three layers 3, 5 and 7 which are engineered to create desired diode properties. Specifically, FIG. 3 shows band gap diagrams of diode 12 in an unbiased condition (diagram 40), a forward biased condition (diagram 42) and a reverse biased condition (diagram 44). Diagrams 40 and 44 show that in an unbiased condition, and in a reverse biased condition, bands from dielectric materials 3, 5 and 7 preclude migration of carriers between conductive materials 23 and 17. In contrast, diagram 42 shows that tunneling may occur in a forward biased condition so that carriers (specifically electrons in the shown embodiment) may tunnel from conductive material 23 to conductive material 17 via quantum wells 43. The flow of the electrons is diagrammatically illustrated with a dashed arrow 45 in FIG. 3.

The band structures of FIG. 3 may be considered to be band-gap engineered structures. Heterostructures may be formed by molecular beam epitaxy (MBE) growth of III/V materials. In dielectric materials, a band gap may be engineered through thermal treatments (such as thermal treatment of aluminum oxides), as is known for nonvolatile memory cells (such as "crested barrier" cells and VARIOT flash cells). The band-gap engineered structures may exploit characteristics of band-edge discontinuities in carrier transport in the semiconductor, and/or may exploit characteristics of band-edge discontinuities in charge storage of the dielectric.

The diode 12 of FIG. 1 is one example embodiment diode. Other example embodiment diodes are shown in FIGS. 4-6.

Figure 4:
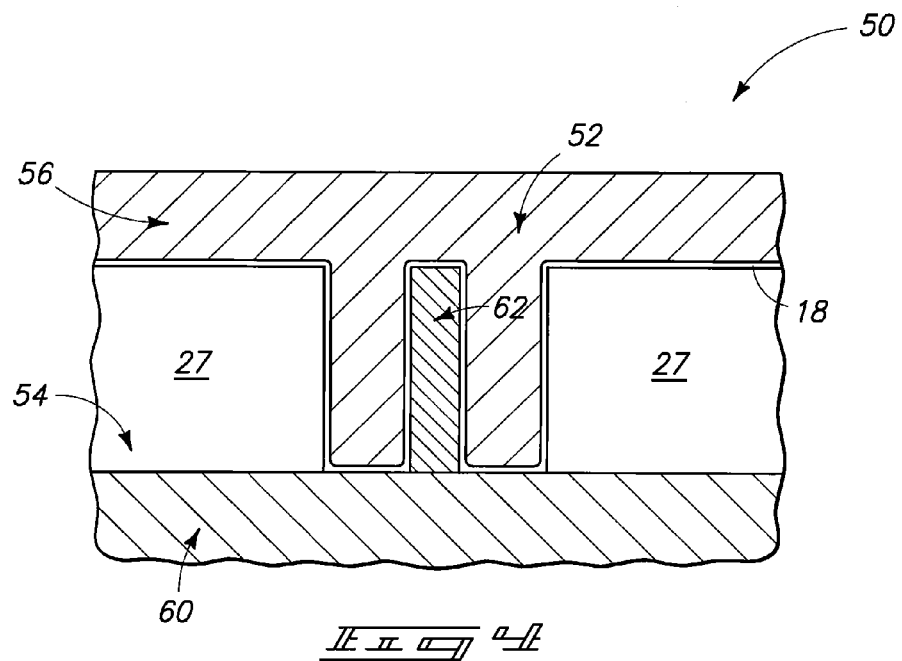
FIG. 4 is a diagrammatic, cross-sectional view of a portion of a construction illustrating an embodiment.

FIG. 4 shows a portion of a construction 50 comprising a diode 52. Construction 50 may be a semiconductor construction. The diode 52 includes a lower electrode 54 comprising a base 60 and a single pedestal 62 extending upwardly from the base. The diode also includes an upper electrode 56 and the intermediate diode structure 18 between the upper and lower electrodes. The base 60 and pedestal 62 of the lower electrode may comprise any of the compositions discussed above with reference to FIG. 1 for the base 20 and pedestals 22 and 24; and the upper electrode 56 of FIG. 4 may comprise any of the compositions discussed above with reference to FIG. 1 for the upper electrode 16. Portions of the upper electrode are supported by the insulative material 27. The pedestal 62 may have a width suitable for fabrication utilizing conventional patterning.

FIG. 5 shows a portion of a construction 70 comprising a diode 72. The construction 70 may be a semiconductor construction. The diode 72 includes a lower electrode 74 comprising a base 80 and a plurality of pedestals 82, 84 and 86 extending upwardly from the base. The diode also includes an upper electrode 76, and comprises the intermediate diode structure 18 between the upper and lower electrodes. The base 80 and pedestals 82, 84 and 86 of the lower electrode may comprise any of the compositions discussed above with reference to FIG. 1 for the base 20 and pedestals 22 and 24; and the upper electrode 76 of FIG. 5 may comprise any of the compositions discussed above with reference to FIG. 1 for the upper electrode 16. Portions of the upper electrode are supported by the insulative material 27. The pedestals 82, 84 and 86 may have widths suitable for fabrication utilizing conventional patterning; and at least one of the pedestals may have a different width than at least one other of the pedestals (as shown), or in other embodiments all of the pedestals may have the same widths as one another.

FIG. 6 shows a portion of a construction 100 comprising a diode 102. The construction 100 may be a semiconductor construction. The diode 102 includes a lower electrode 104 comprising a base 110 and a plurality of pedestals 112, 114, 116, 118, 120 and 122 extending upwardly from the base. The diode also includes an upper electrode 106, and comprises the intermediate diode structure 18 between the upper and lower electrodes. The base 110 and pedestals 112, 114, 116, 118, 120 and 122 of the lower electrode may comprise any of the compositions discussed above with reference to FIG. 1 for the base 20 and pedestals 22 and 24; and the upper electrode 106 of FIG. 6 may comprise any of the compositions discussed above with reference to FIG. 1 for the upper electrode 16. Portions of the upper electrode are supported by the insulative material 27. The pedestals 112, 114, 116, 118, 120 and 122 may be too narrow for fabrication utilizing conventional patterning, and instead may be formed by seeding followed by growth of columns over the seeds, as discussed below with reference to FIGS. 14-17.

The diodes described above may be formed by any suitable methods. An example method for forming a diode analogous to that of FIG. 1 is described with reference to FIGS. 7-10.

Referring to FIG. 7, construction 10 is shown at a processing stage in which insulative material 27 is formed over base 20, and is patterned to have an opening 120 extending therethrough. The patterning of material 27 may comprise photolithographic processing. Specifically, material 27 may be formed as a uniform expanse across base 20, a photolithographically-patterned photoresist mask (not shown) may be formed over material 27, a pattern may be transferred from the photoresist mask to material 27 with one or more suitable etches, and the photoresist mask may then be removed to leave the shown construction of FIG. 7.

Referring to FIG. 8, electrically conductive material 23 is formed across material 27 and within opening 120. The conductive material partially fills the opening to narrow the opening. Spacer material 122 is formed within the narrowed opening as a pair of spacers 123 along the sidewalls of the narrowed opening. The spacers may be fabricated by initially forming a continuous layer of spacer material 122 across material 27 and within opening 120, and then subjecting the spacer material to an anisotropic etch to remove most of the spacer material while leaving the shown spacers.

Figure 9:
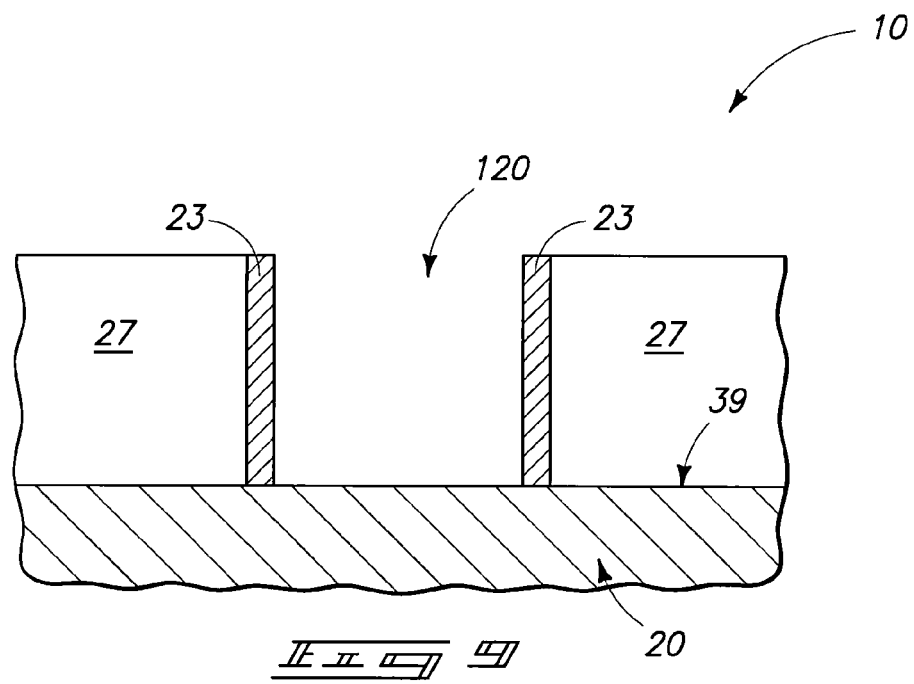

Referring to FIG. 9, construction 10 is illustrated after utilization of the spacers 123 (FIG. 8) as a mask to pattern the material 23, and after subsequent removal of the spacers.

Figure 10:
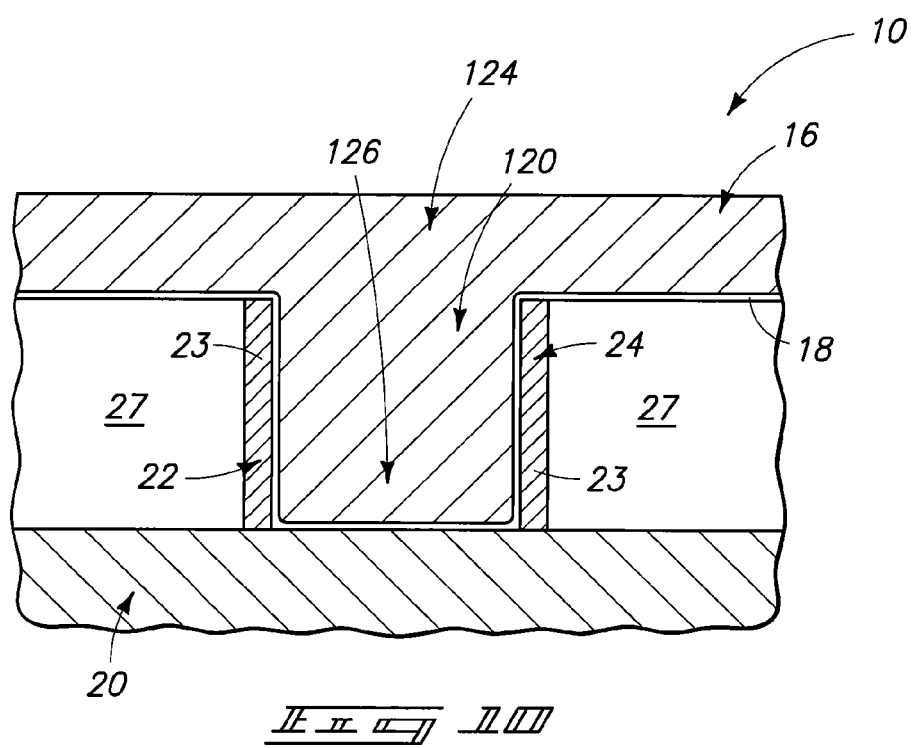

Referring to FIG. 10, intermediate diode structure 18 is formed by deposition of one or more layers over materials 23 and 27, and within opening 120; and subsequently the second electrode 16 is formed over the intermediate diode structure 18. The one or more layers of intermediate diode structure 18 may be formed by any suitable method. The layers of intermediate diode structure 18 may be formed to be very conformal across the underlying materials if they are formed by atomic layer deposition (ALD).

The construction of FIG. 10 comprises a diode 124 similar to the diode 12 of FIG. 1. Like diode 12 of FIG. 1, the diode 124 comprises pedestals 22 and 24 of material 23 extending upwardly from base 20.

In some embodiments (not shown), the material 23 of the pedestals may be patterned with a mask other than the spacers of FIG. 8, so that some of the material 23 is left to extend across the base in a gap 126 between the pedestals 22 and 24. In some embodiments, spacers 123 (FIG. 8) may be omitted, and the liner 23 may be anisotropically etched to form the projections 22 and 24.

Figure 11:
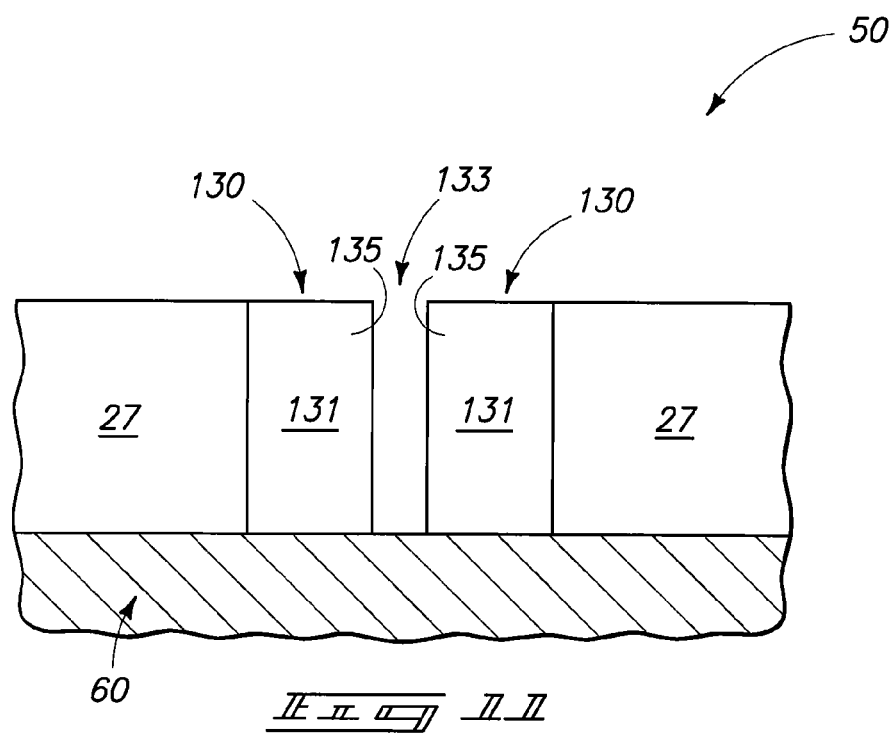
Figure 12:
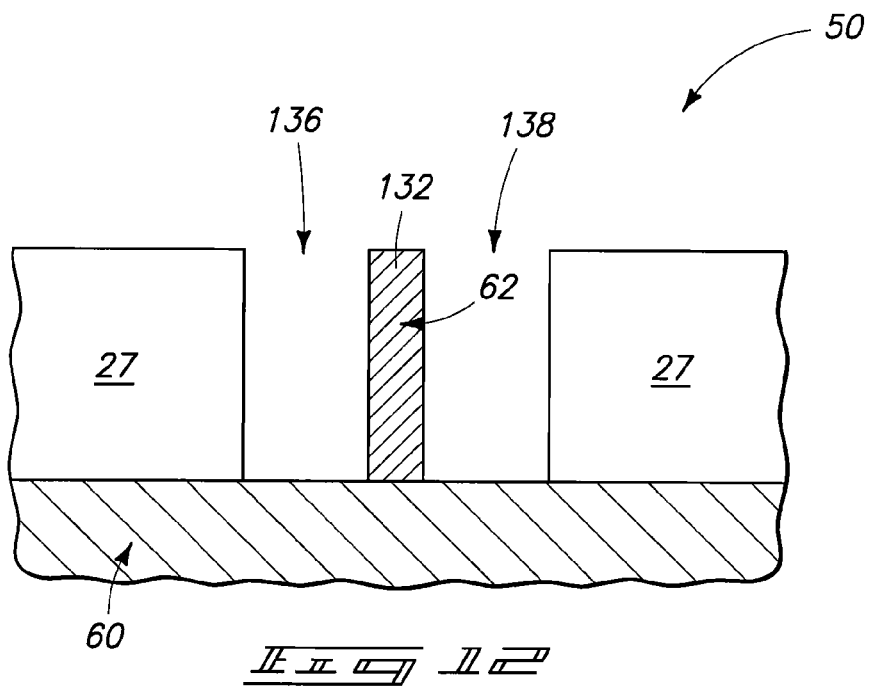

FIGS. 11-13 illustrate an example method for forming the diode 52 of FIG. 4.

Referring to FIG. 11, construction 50 is shown at a processing stage in which insulative material 27 is formed over base 60, and patterned to have an opening 130 extending therethrough. The patterning of material 27 may comprise photolithographic processing, as discussed above relative to FIG. 7. Spacer material 131 is formed within opening 130, and patterned into a pair of spacers 135. The spacers may be fabricated by initially forming a continuous layer of spacer material 131 across material 27 and within opening 130, and then subjecting the spacer material to an anisotropic etch to remove most of the spacer material while leaving the shown spacers. A narrowed opening 133 extends between the spacers 135.

Referring to FIG. 12, construction 50 is shown after forming electrically conductive material 132 within the narrowed opening 133 (FIG. 11) between the spacers 135 (FIG. 11), and after subsequent removal of the spacers. Openings 136 and 138 are in locations where the spacers were removed from. The construction of FIG. 12 may be considered to have a pedestal 62 of material 132 projecting upwardly from base 60.

Referring to FIG. 13, intermediate diode structure 18 is formed by deposition of one or more layers over materials 60, 132 and 27; and subsequently the second electrode 56 is formed over intermediate diode structure 18 to complete formation of diode 52. The one or more layers of intermediate diode structure 18 may be formed by any suitable method, including, for example, ALD.

FIGS. 14-17 illustrate an example method for forming a diode analogous to the diode 102 of FIG. 6.

Referring to FIG. 14, construction 100 is shown at a processing stage in which insulative material 27 is formed over base 110, and is patterned to have an opening 150 extending therethrough. A layer of material 152 is formed across insulative material 27 and within opening 150. In some embodiments, material 152 is a sacrificial material, and accordingly the material may comprise any composition selectively removable relative to other compositions of construction 100. For instance, in some embodiments material 152 may comprise, consist essentially of, or consist of silicon dioxide, silicon nitride or silicon oxynitride.

Figure 15:
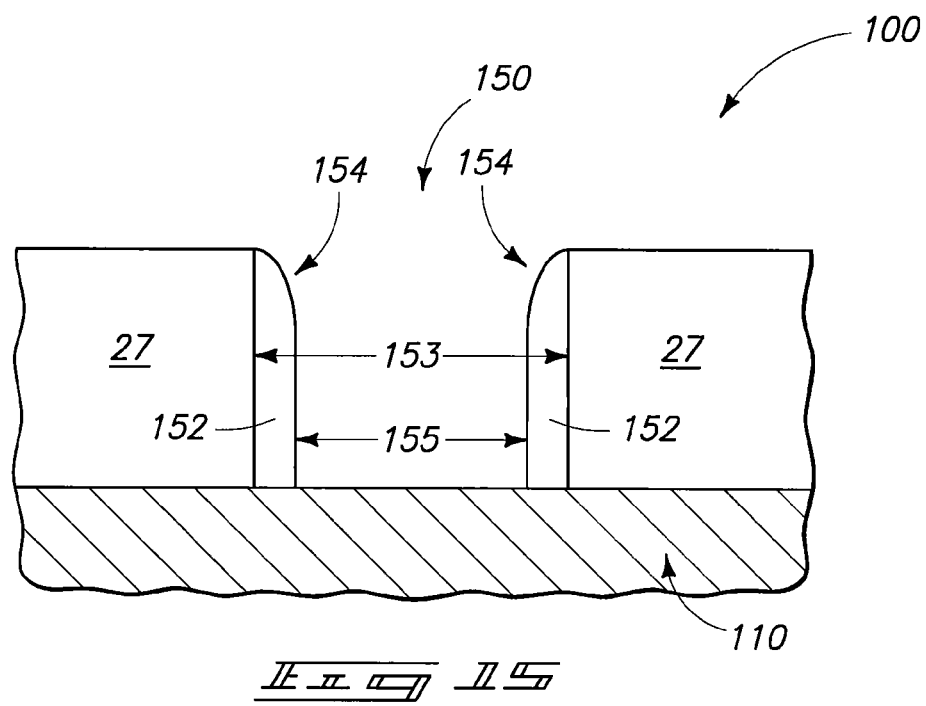

Referring to FIG. 15, material 152 is anisotropically etched to form the material into sidewall spacers 154. The sidewall spacers 154 are along sidewalls of material 27 at the periphery of opening 150, and narrow the opening. The opening is shown to have a first width 153, and the insulative material is shown to narrow such width to a second width 155. In some embodiments, the first width 153 may be from about 200 nanometers to about two microns, and the sidewall spacers 154 may have widths of from about 50 angstroms to about 100 angstroms, so that the second width 155 is at least about 90 percent of the first width.

Figure 16:
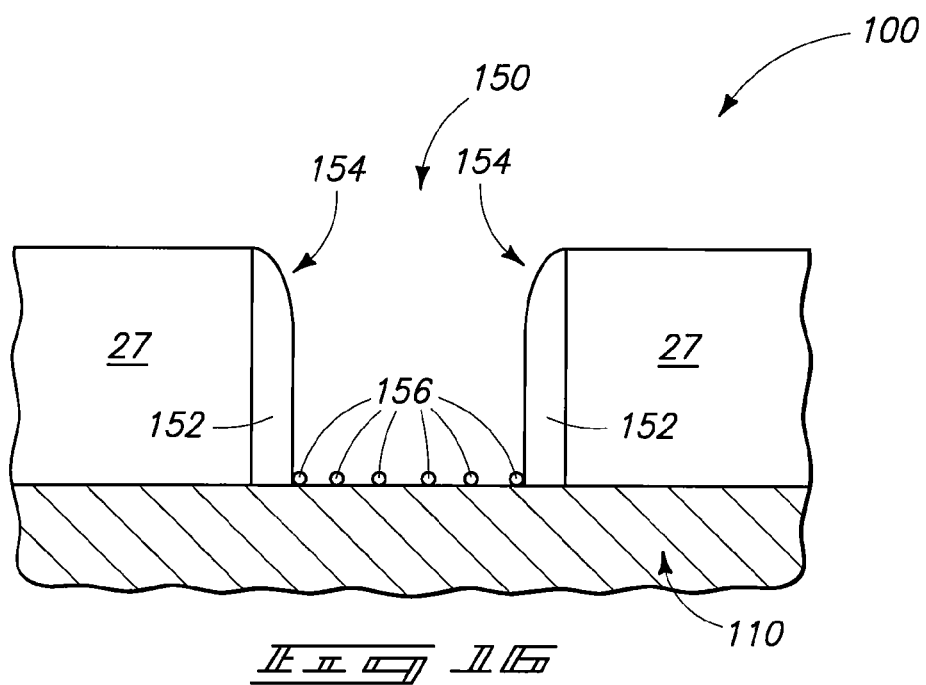

Referring to FIG. 16, seed material 156 is dispersed along a bottom of opening 150. In the shown embodiment, an upper surface of conductive base 110 is exposed along the bottom of opening 150, and the seed material is dispersed directly on such upper surface of the base. The sidewall spacers 152 preclude the seed material from being directly against the sides of insulative material 27.

The seed material may be electrically conductive, and may, for example, be metal-containing nanocrystals (such as, for example, nanocrystals comprising one or more of platinum, nickel, gold, silver, copper, palladium, tungsten, titanium, ruthenium, etc.). The term "nanocrystals" is used herein to refer to crystalline material (either polycrystalline or monocrystalline) having a maximum cross-sectional dimension of less than or equal to about 10 nanometers. The seed material may consist of nanocrystals (in other words, may consist of nanocrystalline seeds), or may comprise nanocrystals in combination with other seed material that is larger than nanocrystals.

Figure 17:
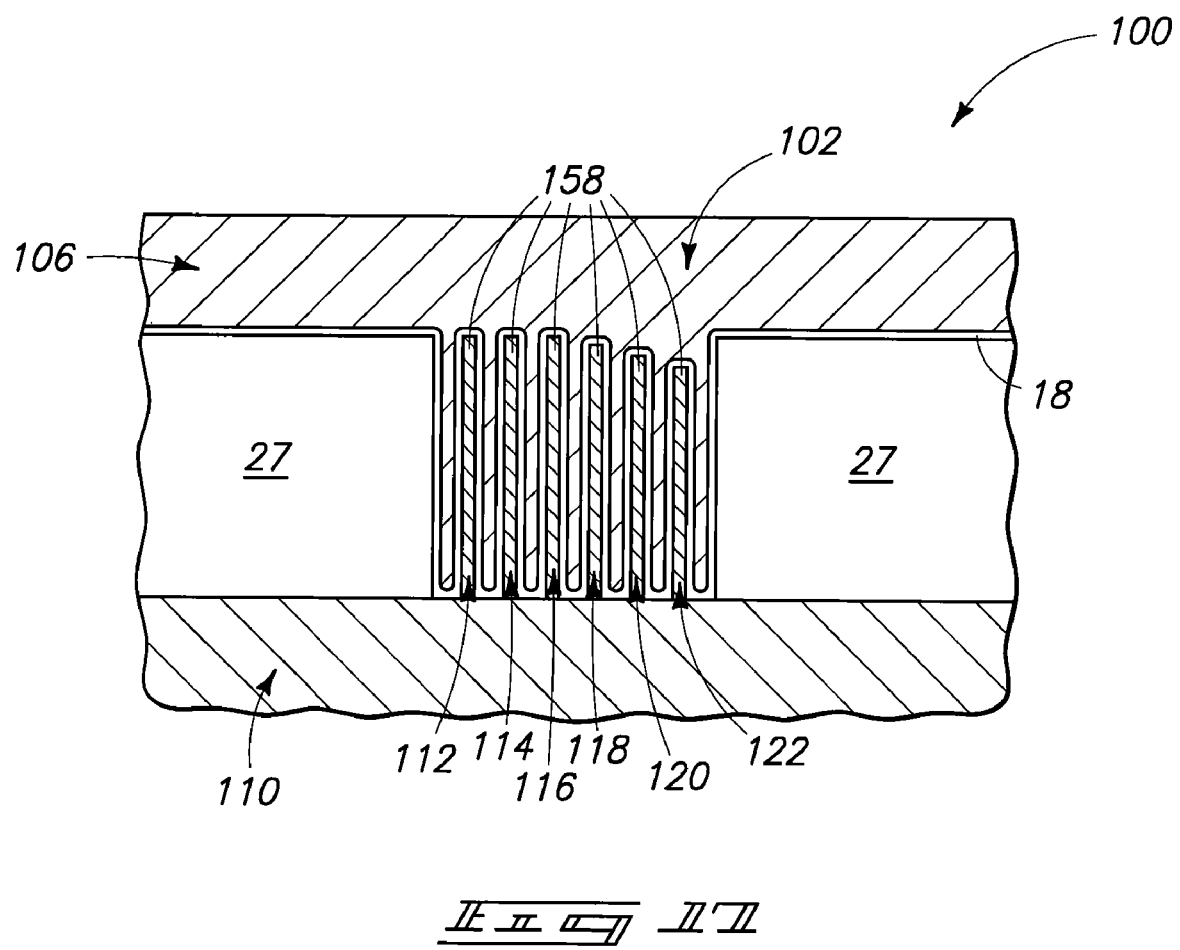

Referring to FIG. 17, spacers 154 are removed, and electrically conductive pedestals 112, 114, 116, 118, 120 and 122 are formed over seeds 156 (FIG. 16) by growing conductive material 158 over the seed material. The conductive material may, for example, comprise, consist essentially of, or consist of nanorods of conductively-doped silicon, carbon and/or other appropriately electrically conductive materials formed using chemical vapor deposition (CVD), plasma CVD, molecular-beam epitaxy (MBE) or any other suitable deposition techniques.

Pedestals 112, 114, 116, 118, 120 and 122 may be considered to be spaced from one another by valleys, and an undulating topography of a surface of the lower electrode may be considered to extend over the pedestals and down into the valleys.

Pedestals 112, 114, 116, 118, 120 and 122 of FIG. 17 are similar to those of FIG. 6, except that some of the pedestals of FIG. 17 are at different heights relative to others, whereas the pedestals of FIG. 6 are all of the same height. FIGS. 6 and 17 thus illustrate similar but slightly different embodiments.

Intermediate diode structure 18 is formed by deposition of one or more layers over and between pedestals 112, 114, 116, 118, 120 and 122; and subsequently the second electrode 106 is formed over intermediate diode structure 18 to complete formation of diode 102. The one or more layers of intermediate diode structure 18 may be formed by any suitable method, including, for example, ALD.

The various methods described with reference to FIGS. 7-17 show single diodes being formed. The single diodes may be representative a large plurality of diodes that are simultaneously formed as part of an integrated circuit fabrication process. The diodes may be part of, for example, a memory array or a logic circuit. Thus, the single openings 120, 130 and 150 of FIGS. 7, 11 and 14, respectively, may be representative of large pluralities of openings that are simultaneously subjected to identical processing.

In some embodiments, two or more of the above-discussed embodiments may be combined. For instance, the processing of FIGS. 7-9 may be utilized to form a pair of pedestals of a lower diode electrode, and the processing of FIGS. 11-12 and/or the processing of FIGS. 14-17 may utilized to form additional pedestals of the lower electrode.

The diodes formed in accordance with various embodiments may be utilized for selectively accessing various integrated circuit components, such as memory cells, logic devices, etc. Integrated circuitry comprising such diodes may be utilized in a broad range of electronic systems, such as, for example, clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a diode, comprising:
   forming a first electrode that comprises one or more electrically conductive pedestals extending upwardly from an electrically conductive base; said one or more pedestals having top surfaces, and having sidewall surfaces extending from the base to the top surfaces;
   depositing one or more layers across the top surface and the sidewall surfaces of the one or more pedestals;
   forming a second electrode over said one or more layers;
   wherein the first electrode, one or more layers, and second electrode together form a structure that conducts current between the first and second electrodes when voltage of one polarity is applied to the structure, and that inhibits current flow between the first and second electrodes when voltage having a polarity opposite to said one polarity is applied to the structure; and
   wherein the forming the first electrode comprises:
      forming an insulative material across the electrically conductive base;
      patterning an opening that extends through the insulative material to the electrically conductive base;
      lining the opening with electrically conductive material; and
      patterning the lining into at least one of the one or more pedestals.

2. The method of claim 1 wherein the one or more layers are at least two layers.

3. The method of claim 1 wherein the one or more layers are only one layer.

4. A method of forming a diode, comprising:
   forming a first electrode having an undulating topography, the undulating topography comprising a lowest surface and a highest surface; the highest surface being above the lowest surface by a distance;
   conformally depositing one or more layers across the undulating topography, the one or more layers together having a thickness that is less than or equal to about 10% of the distance;
   forming a second electrode over said one or more layers; and
   wherein the first electrode, one or more layers, and second electrode together form a structure that conducts current from the first electrode to the second electrode when a first voltage is applied across the first and second electrodes, and that inhibits current from flowing from the second electrode to the first electrode when a second voltage having a polarity opposite to a polarity of the first voltage is applied across the first electrode and the second electrode.

5. The method of claim 4 wherein the conformally depositing the one or more layers comprises atomic layer deposition.

6. The method of claim 4 wherein the forming the first electrode comprises:
   forming an electrically conductive material over and directly against an electrically conductive base; and
   etching the electrically conductive material to form the electrically conductive material into at least one projection that extends upwardly from the base.

7. The method of claim 6 further comprising:
   forming a patterned insulative material over the base, the patterned insulative material having at least one opening extending therethrough to the base;
   forming the electrically conductive material as a liner within the at least one opening; and
   wherein the etching comprises anisotropically etching the liner to form the at least one projection.

8. The method of claim 6 wherein the electrically conductive material comprises a same composition as the base.

9. The method of claim 6 wherein the electrically conductive material comprises a different composition from the base.

10. The method of claim 4 wherein the forming the first electrode comprises:
    etching an opening that extends through an insulative material and to an electrically conductive base;
    forming at least one sidewall spacer along sidewalls of the opening to narrow the opening, the base being exposed along a bottom of the narrowed opening;
    dispersing seed material along the bottom of the narrowed opening; and
    growing pedestals from the dispersed seed material, the pedestals being spaced from one another by valleys, the undulating topography extending across the pedestals and valleys.

11. The method of claim 10 wherein the dispersed seed material consists of nanocrystalline seeds.

12. The method of claim 10 further comprising removing the at least one sidewall spacer after dispersing the seed material.

13. The method of claim 4 wherein the distance is at least about 50 nanometers.

14. The method of claim 13 wherein the thickness is from about 1 nanometer to about 4 nanometers.

15. A method of forming a diode, comprising:
  forming a first electrode that comprises two or more projections extending upwardly from a base; said protections being spaced from one another by at least one gap that extends to an upper surface of the base;
  depositing one or more layers across the projections and within the at least one gap;
  forming a second electrode over said one or more layers;
  wherein the first electrode, one or more layers, and second electrode together form a structure that conducts current between the first and second electrodes when voltage of one polarity is applied to the structure, and that inhibits current flow between the first and second electrodes when voltage having a polarity opposite to said one polarity is applied to the structure; and
  wherein the forming the first electrode comprises:
    forming a patterned insulative material over the base, the patterned insulative material having at least one opening extending therethrough to the base;
    forming electrically conductive material within the at least one opening; and
    etching the electrically conductive material to form the projections.

16. A method of forming a diode, comprising:
  forming a first electrode that comprises two or more projections extending upwardly from a base; said projections being spaced from one another by at least one gap that extends to an upper surface of the base;
  depositing one or more layers across the projections and within the at least one gap;
  forming a second electrode over said one or more layers;
  wherein the first electrode, one or more layers, and second electrode together form a structure that conducts current between the first and second electrodes when voltage of one polarity is applied to the structure, and that inhibits current flow between the first and second electrodes when voltage having a polarity opposite to said one polarity is applied to the structure; and
  wherein the forming the first electrode comprises:
    forming a patterned insulative material over the base, the patterned insulative material having at least one opening extending therethrough to the base;
    forming electrically conductive material as a liner within the at least one opening; and
    etching the liner to form the projections.

17. A method of forming a diode, comprising:
  forming a first electrode that comprises two or more projections extending upwardly from a base; said projections being spaced from one another by at least one gap that extends to an upper surface of the base;
  depositing one or more layers across the projections and within the at least one gap;
  forming a second electrode over said one or more layers;
  wherein the first electrode, one or more layers, and second electrode together form a structure that conducts current between the first and second electrodes when voltage of one polarity is applied to the structure, and that inhibits current flow between the first and second electrodes when voltage having a polarity opposite to said one polarity is applied to the structure; and
  wherein the forming the first electrode comprises:
    etching an opening that extends through an insulative material and to the base;
    forming at least one sidewall spacer along sidewalls of the opening to narrow the opening, the base being exposed along a bottom of the narrowed opening;
    dispersing seed material along the bottom of the narrowed opening; and
    growing pedestals from the dispersed seed material.

18. A diode, comprising:
  a first electrode having an undulating topography, the undulating topography comprising a lowest surface and a highest surface; the highest surface being above the lowest surface by a distance;
  one or more layers across the undulating topography, the one or more layers together having a thickness that is less than or equal to about 10% of the distance;
  a second electrode over said one or more layers; and
  wherein the first electrode, one or more layers, and second electrode together form a structure that is configured to conduct current from the first electrode to the second electrode when a first voltage is applied across the first and second electrodes, and that is configured to inhibit current from flowing from the second electrode to the first electrode when a second voltage having a polarity opposite to a polarity of the first voltage is applied across the first electrode and the second electrode.

19. The diode of claim 18 wherein the one or more layers are at least two layers.

20. The diode of claim 18 wherein the one or more layers are only one layer.

21. The diode of claim 18 wherein the distance is at least about 50 nanometers.

22. The diode of claim 21 wherein the thickness is from about 1 nanometer to about 4 nanometers.

* * * * *